(12) United States Patent
Yin

(10) Patent No.: US 12,740,301 B2
(45) Date of Patent: Sep. 15, 2026

(54) DISPLAY PANEL

(71) Applicant: TCL China Star Optoelectronics Technology Co., Ltd., Shenzhen (CN)

(72) Inventor: Zhiyuan Yin, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 188 days.

(21) Appl. No.: 18/897,049

(22) Filed: Sep. 26, 2024

(65) Prior Publication Data

US 2026/0047322 A1 Feb. 12, 2026

(30) Foreign Application Priority Data

Aug. 9, 2024 (CN) ........................ 202411087683.9

(51) Int. Cl.

| | |
|---|---|
| ***H10K 59/80*** | (2023.01) |
| ***H10K 59/122*** | (2023.01) |
| ***H10K 59/131*** | (2023.01) |
| ***H10K 59/38*** | (2023.01) |

(52) U.S. Cl.

CPC ....... *H10K 59/8792* (2023.02); *H10K 59/122* (2023.02); *H10K 59/131* (2023.02); *H10K 59/38* (2023.02)

(58) Field of Classification Search

CPC ............. H10K 59/8792; H10K 59/122; H10K 59/131; H10K 59/38; H10K 59/121; H10K 59/80

See application file for complete search history.

(56) References Cited

U.S. PATENT DOCUMENTS

| | | | | |
|---|---|---|---|---|
| 2021/0020709 | A1* | 1/2021 | Yang | H10K 59/121 |
| 2021/0334504 | A1* | 10/2021 | Lu | G06F 3/0412 |
| 2021/0405792 | A1* | 12/2021 | Zhang | G02F 1/13338 |
| 2022/0271103 | A1* | 8/2022 | Hai | G06V 10/143 |

* cited by examiner

*Primary Examiner* — Elmito Breval

(74) *Attorney, Agent, or Firm* — Menachem Nathan; Nathan & Associates

(57) ABSTRACT

A display panel includes one or more elevating bodies disposed on a side of a black matrix layer closer to a substrate. In a plan view of the display panel, each of first openings of the black matrix layer has a pattern with a center point, and a contoured edge of the first opening has points with different distances to the center point among which a first point has the longest distance. The elevating body corresponding to the first opening is located in an area of the contoured edge outside the first point and overlaps with part of the contoured edge, and the one or more elevating bodies are configured to elevate one or more parts of the black matrix layer.

20 Claims, 9 Drawing Sheets

DISPLAY PANEL

CROSS-REFERENCE TO RELATED APPLICATION

This disclosure claims priority to Chinese Patent Application No. 202411087683.9, filed with the China National Intellectual Property Administration (CNIPA) on Aug. 9, 2024, the disclosure of which is incorporated herein by reference in its entirety.

TECHNICAL FIELD

The present disclosure relates to the field of display technology, for example, to a display panel.

BACKGROUND

In an organic light-emitting display panel, to increase the light transmittance of the panel, a color filter layer is usually provided in the display panel instead of a polarizer, thereby reducing the power consumption of the entire device. The color filter layer includes a black matrix layer and a color film layer, the black matrix layer has multiple openings, the color film layer consists of portions disposed in the openings and corresponding to sub-pixels, and the black matrix layer corresponds to gaps between adjacent sub-pixels. However, the size of the openings of the black matrix layer is very small, and when light enters the color film layer and then is reflected out, a more serious diffraction phenomenon occurs, and therefore color separation occurs to the panel in the white ambient light, affecting the use.

SUMMARY

Embodiments of the present disclosure provide a display panel. The display panel includes a substrate, a driver circuit layer, a light-emitting device layer, a black matrix layer, a color film layer, and one or more elevating bodies.

The driver circuit layer is disposed on the substrate.

The light-emitting device layer is disposed on a side of the driver circuit layer away from the substrate.

The black matrix layer is disposed on a side of the light-emitting device layer away from the substrate, and the black matrix layer is provided with multiple first openings.

The color film layer is disposed on the side of the light-emitting device layer away from the substrate and consists of portions disposed in the first openings.

The elevating bodies are disposed on a side of the black matrix layer closer to the substrate. Each elevating body corresponds to at least one of the first openings.

In a plan view of the display panel, each of the first openings has a pattern with a center point, and a contoured edge of the first opening has points with different distances to the center point among which a first point has the longest distance. The elevating body corresponding to the first opening is located in an area of the contoured edge outside the first point, the elevating body overlaps with part of the contoured edge, and the one or more elevating bodies are configured to elevate one or more parts of the black matrix layer.

DETAILED DESCRIPTION

Embodiments of the present disclosure provide a display panel, which is described in detail below.

It is to be understood that in an organic light-emitting display panel, a color filter layer is used instead of a polarizer to increase the light transmittance of the display panel. The color filter layer includes a black matrix layer and a color film layer, and the color film layer consists of portions disposed in the openings of the black matrix layer. The size of the openings is small, so serious diffraction phenomena (like small aperture diffraction) will occur when light enters the openings. Moreover, the smaller the size of the opening, the shorter the travel path of the light, the stronger the restriction of the light, and the more pronounced the diffraction effect.

Thus, for the display panel in the embodiments of the present disclosure, a portion of the opening may be elevated, where the size of the portion is relatively small. Thus, the optical path of the light entering the small-size portion is increased, thereby ameliorating the diffraction effect.

Figure 1:
FIG. 1 is a plan view of a display panel provided by embodiments of the present disclosure.
Figure 1:
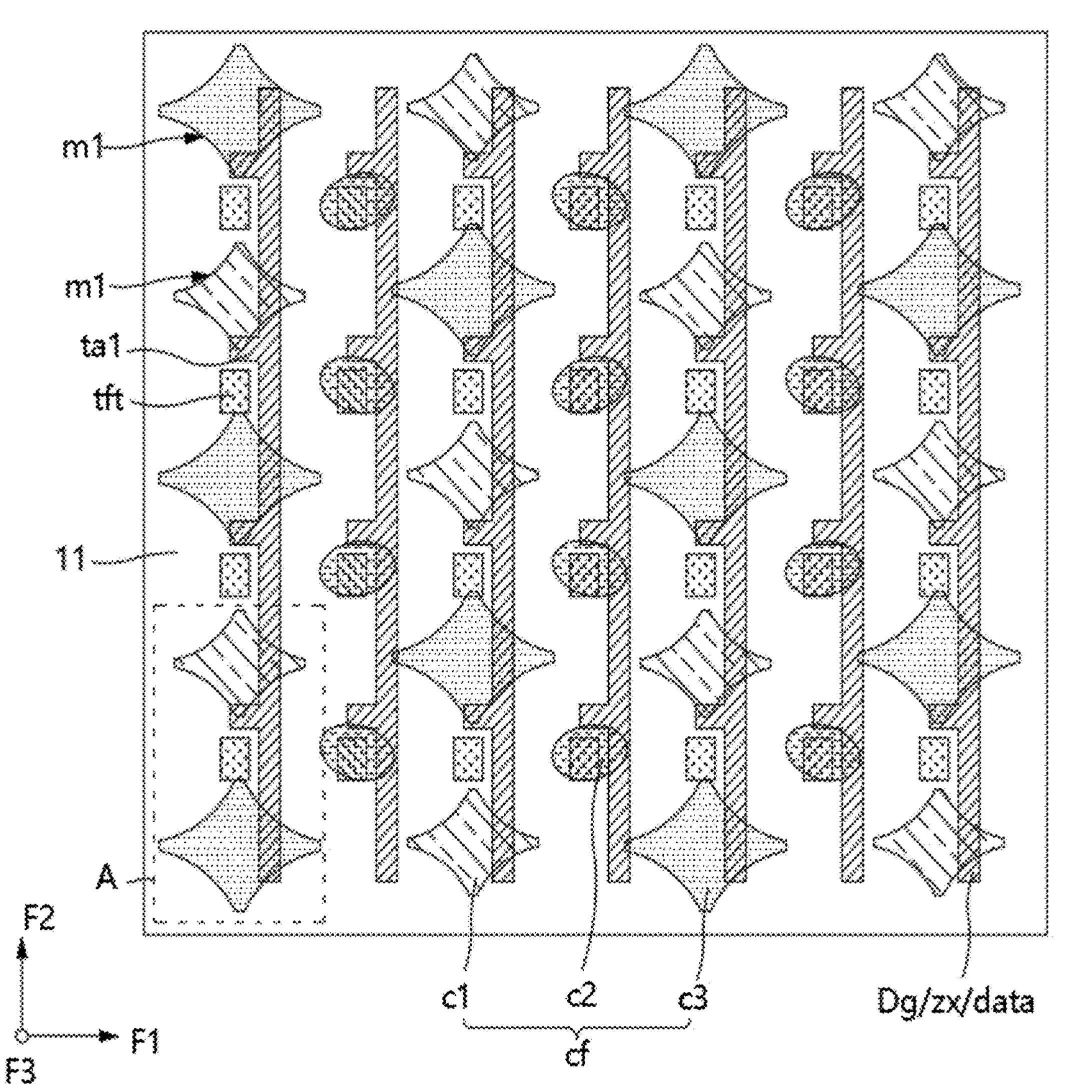
Figure 3:
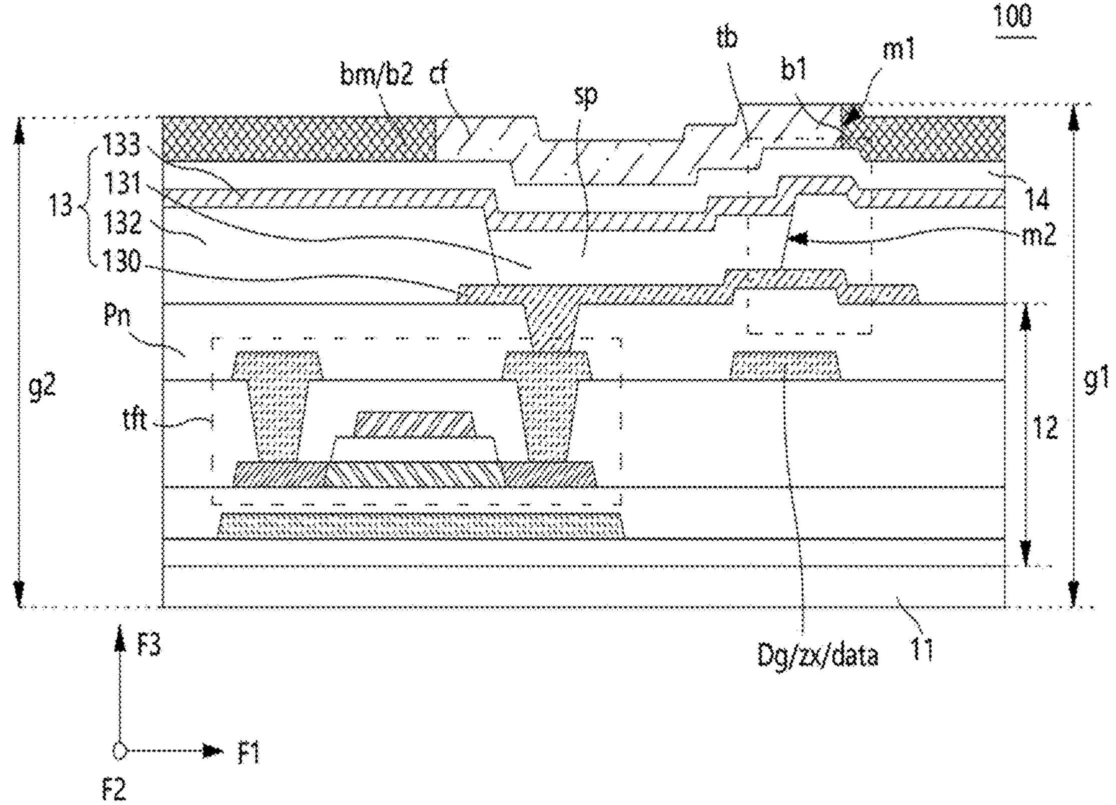
FIG. 3 is a cross-sectional view of a display panel provided by embodiments of the present disclosure.

In FIGS. 1 and 3, the first direction F1 may be a direction parallel to one side of the display panel 100 in the plan view, and may be, for example, the lateral direction of the display panel 100. The second direction F2 may be a direction parallel to another side of the display panel 100 in the plan view, and may be the longitudinal direction of the display panel 100. The third direction F3 may be the thickness direction of the display panel 100. In some embodiments, the first direction F1 may also intersect the second direction F2 non-perpendicularly.

The display panel 100 may have a rectangular shape or a square shape in the plan view, but the embodiments are not limited thereto. In some embodiments, the display panel 100 may have a rectangular shape with perpendicular corners, rounded corners, chamfered corners or concave corners in the plan view. The display panel 100 may include, but not limited to, two long edges arranged in the first direction F1 and two short edges arranged in the second direction F2 in the plan view; alternatively, the display panel 100 may include, but not limited to, two short edges arranged in the first direction F1 and two long edges arranged in the second direction F2.

Referring to FIGS. 1 and 3, embodiments of the present disclosure provide a display panel 100, and the display panel 100 includes a substrate 11, a driver circuit layer 12, a light-emitting device layer 13, an encapsulation layer 14, a black matrix layer bm, a color film layer cf, and elevating bodies Dg.

The driver circuit layer 12 is disposed on the substrate 11. The light-emitting device layer 13 is disposed on a side of the driver circuit layer 12 away from the substrate 11. The black matrix layer bm and the color film layer cf are disposed on a side of the light-emitting device layer 13 away from the substrate 11. The elevating bodies Dg are disposed on a side of the black matrix layer bm and the color film layer closer to the substrate 11.

The black matrix layer bm is provided with multiple first openings m1, and the color film layer cf consists of portions disposed in the first openings m1.

In a plan view (e.g., FIG. 2) of the display panel 100, the pattern of each first opening m1 has a center point zx, and points on the contoured edge Lk of the first opening m1 have different distances from the center point zx. The contoured edge Lk has a first point L1, and the distance from the first point L1 to the center point zx is the longest distance. The elevating body Dg is located in an area outside the first point L1 of the contoured edge Lk, and the elevating body Dg overlaps with part of the contoured edge Lk. The elevating body Dg is configured to elevate part of the black matrix layer bm.

It is to be understood that the center point zx of the pattern is the geometric center of the two-dimensional pattern. The display panel 100 of the embodiments of the present disclosure employs the elevating body Dg to elevate an area of the pattern of the first opening m1 outside the first point L1, and thus in a view from the thickness direction F3, the distances from the light-emitting center fg of a sub light-emitting layer sp to points in the area outside the first point L1 approach or are equal to the distance from the light-emitting center fg of the sub light-emitting layer sp to the first point L1, thereby ameliorating the diffraction effect of light emitted from the first opening m1.

Optionally, the driver circuit layer 12 includes thin-film transistors tft, scan lines, data lines data, etc., and the driver circuit layer 12 is configured to drive the light-emitting device layer 13. The thin-film transistors tft may be thin-film transistors of a top-gate type, a bottom-gate type, a double-gate type or a vertical type.

Optionally, the driver circuit layer 12 includes a planarization layer Pn, the planarization layer Pn covering the thin-film transistors tft and the data lines data.

Optionally, the light-emitting device layer 13 includes a light-emitting layer 131, the light-emitting layer 131 includes multiple sub light-emitting layers sp, and each of the sub light-emitting layers sp corresponds to the first openings m1. The sub light-emitting layers sp include red sub light-emitting layers, green sub light-emitting layers, and blue sub light-emitting layers.

Optionally, the light-emitting layer 131 may be an organic light-emitting layer or a quantum dot light-emitting layer.

In some embodiments of the present disclosure, the light-emitting device layer 13 further includes a layer of anodes 130, a pixel defining layer 132, and a layer of cathodes 133. The layer of anodes 130 is disposed on a side of the driver circuit layer 12 away from the substrate 11 and is electrically connected to the thin-film transistors tft. The pixel defining layer 132 is disposed on a side of the driver circuit layer 12 away from the substrate 11. The pixel defining layer 132 is provided with multiple second openings m2, and the second openings m2 expose the anodes 130. Sub light-emitting layers sp of the light-emitting layer 131 are correspondingly disposed in the second openings m2. The second openings m2 are in one-to-one correspondence with the first openings m1. The cathodes 133 are disposed on a side of the light-emitting layer 131 away from the substrate 11. The encapsulation layer 14 covers the cathodes 133.

For example, the encapsulation layer 14 covers a side of the cathodes 133 away from the substrate 11.

The second openings m2 are in one-to-one correspondence with the first openings m1. For one first opening m1 and its corresponding second opening m2, the first opening m1 and the second opening m2 have the same pattern shape, and the outer contour Lk of the first opening m1 is disposed outside the perimeter of the second opening m2.

In some embodiments of the present disclosure, the light-emitting device layer 13 may further include a hole injection layer, a hole transport layer, an electron transport layer, and an electron injection layer. The hole injection layer may be disposed on the layer of anodes, and the hole transport layer, an emissive layer, the electron transport layer, and the electron injection layer may be sequentially layered on top of the hole injection layer.

Optionally, the encapsulation layer 14 may include a first inorganic layer, an organic layer, and a second inorganic layer provided in a stacked manner, but the embodiments are not limited thereto. For example, the encapsulation layer 14 may be a stack of inorganic and organic layers.

Optionally, the black matrix layer bm and the color film layer cf are provided on a side of the encapsulation layer 14 away from the substrate 11. The color film layer cf includes red color filter blocks c1, green color filter blocks c2, and blue color filter blocks c3. The red color filter blocks c1 correspond to the red sub light-emitting layers, and the pattern shape of the red color filter blocks c1 is the same as the pattern shape of the red sub light-emitting layers, for example, both of them are diamonds, rectangles, ellipses, or other polygons. The pattern size of the red color filter blocks c1 is larger than the pattern size of the red sub light-emitting layers so that the red color filter blocks c1 cover the red sub light-emitting layers completely. The green color filter blocks c2 correspond to the green sub light-emitting layers, and the pattern shape of the green color filter blocks c2 is the same as the pattern shape of the green sub light-emitting layers, for example, both of them are diamonds, rectangles, ellipses, or other polygons. The pattern size of the green color filter blocks c2 is larger than the pattern size of the green sub light-emitting layers so that the green color filter blocks c2 cover the green sub light-emitting layers completely. The blue color filter blocks c3 correspond to the blue sub light-emitting layers, and the pattern shape of the blue color filter blocks c3 is the same as the pattern shape of the blue sub light-emitting layers, for example, both of them are diamonds, rectangles, ellipses, or other polygons. The pattern size of the blue color filter blocks c3 is larger than the pattern size of the blue sub light-emitting layers so that the blue color filter blocks c3 cover the blue sub light-emitting layers completely.

Figure 4:
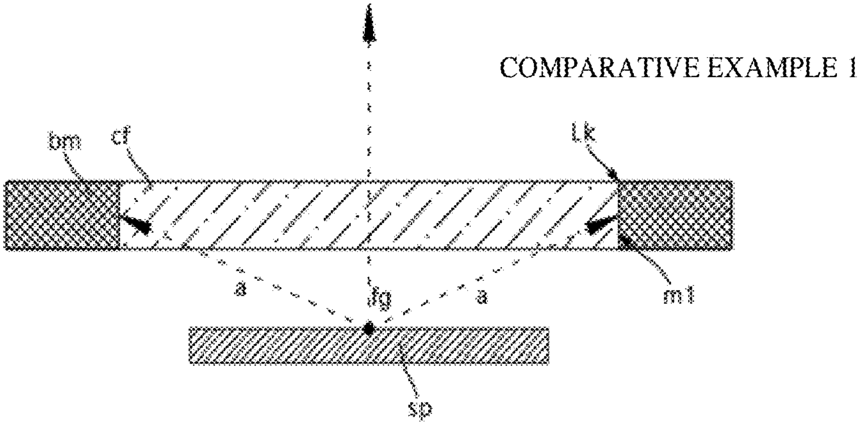
FIG. 4 is a diagram illustrating the optical path of Comparative Example 1 and the optical path of Comparative Example 2.
Figure 4:
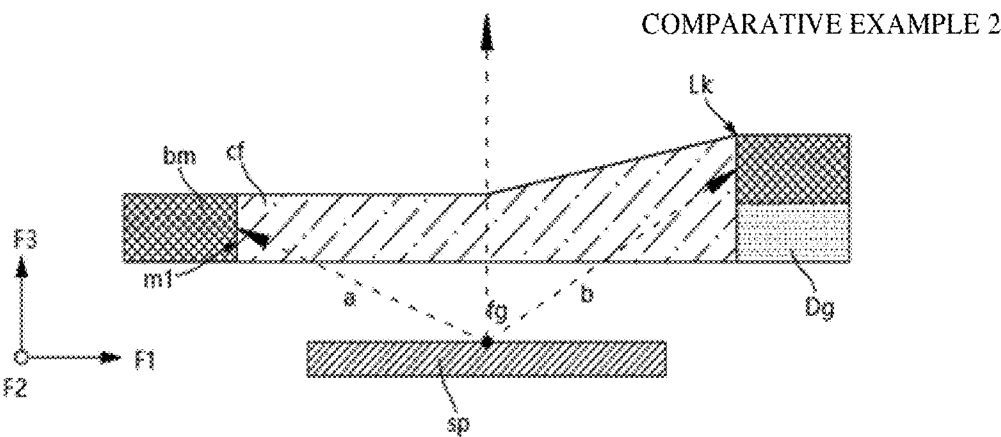

It should be noted, with reference to FIG. 4, that the light emitted from the light-emitting center fg of the sub light-emitting layer sp radiates to the perimeter wall of the first opening m1 of the black matrix layer bm. In Comparative Example 1 (where the first opening m1 is not elevated), the light emitted from the light-emitting center fg of the sub light-emitting layer sp radiates to the contoured edge Lk of the first opening m1 of the black matrix layer bm with an optical path a. In Comparative Example 2 (where the first opening m1 is elevated), part of the black matrix layer bm is elevated by the elevating body Dg such that the optical path in which the light emitted from the light-emitting center fg of the sub light-emitting layer sp radiates to the contoured edge Lk of the first opening m1 of the black matrix layer bm is increased to b, thereby increasing the optical path. Although the pattern of the first opening m1 of the black matrix layer bm is maintained as it is, in fact, the distance of the light travelled in the cases where the elevation has been performed becomes longer, and thus the diffraction effect can be ameliorated. Therefore, when the optical path of the light emitted from the light-emitting center fg of the sub light-emitting layer sp to any point on the contoured edge Lk of the first opening m1 of the black matrix layer bm has the same distance, the overall diffraction effect of the first opening m1 is weakest.

In some embodiments of the present disclosure, the contoured edge Lk has a second point L2, the distance from the second point L2 to the center point zx is the shortest, and the elevating body Dg overlaps at least the second point L2.

Figure 5:
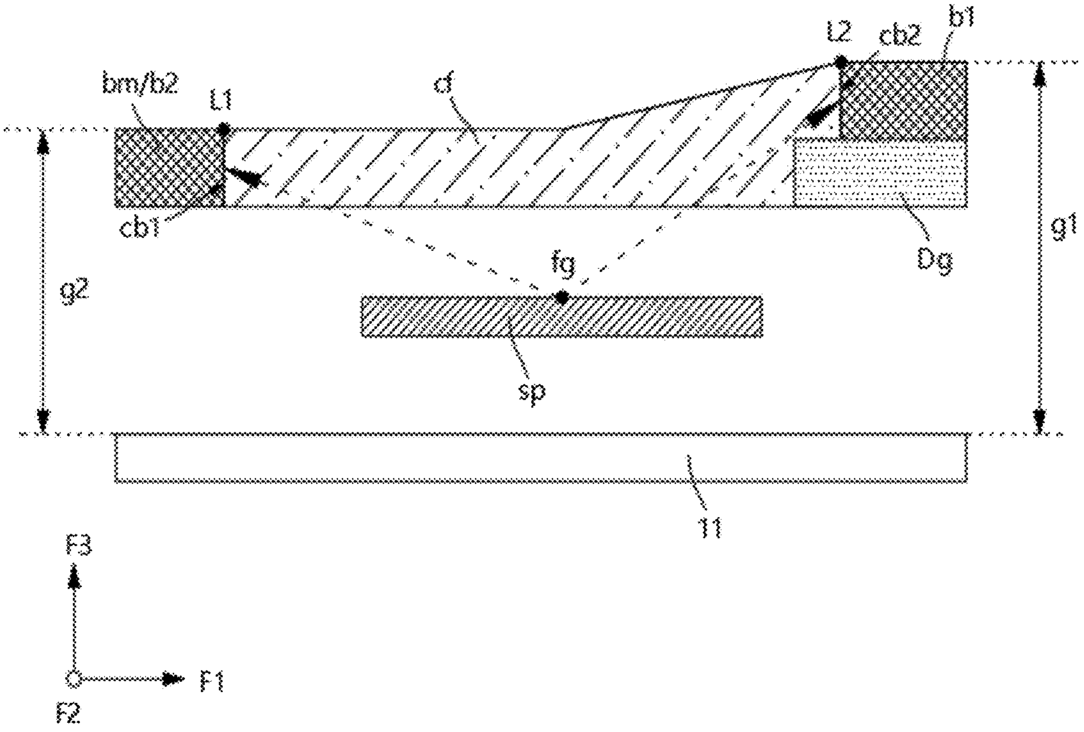
FIG. 5 is a schematic view of a display panel provided by embodiments of the present disclosure, in which part of a first opening is elevated.

The elevating body Dg is employed to elevate at least the second point L2, as shown in FIG. 5, and FIG. 5 is a schematic view of the display panel 100 in which part of the first opening m1 is elevated, as provided by one or more embodiments. It should be noted that in FIG. 5, the black matrix layer bm is provided on the elevating body Dg. The black matrix layer bm may be indirectly provided on the elevating body Dg, i.e., some other film layers are provided between the elevating body Dg and the black matrix layer bm; or the black matrix layer bm may be directly provided on the elevating body Dg.

Referring to FIG. 5, in a view in the thickness direction F3 of the display panel 100, the sidewall of the first opening m1 corresponding to the first point L1 is the first sidewall cb1, the sidewall of the first opening m1 corresponding to the second point L2 is the second sidewall cb2, and the distance from the light-emitting center fg of the sub light-emitting layer sp to the second sidewall cb2 is less than or equal to the distance from the light-emitting center fg of the sub light-emitting layer sp to the first sidewall cb1.

That is, the elevating body Dg elevates the second point L2 such that the optical path from the light-emitting center fg of the sub light-emitting layer sp to the second sidewall cb2 approaches or is equal to the optical path from the light-emitting center fg of the sub light-emitting layer sp to the first point L1.

It is understood that the distance from the second point L2 to the center point zx is the shortest, i.e., when the second point L2 is not elevated, the optical path from the light-emitting center fg of the sub light-emitting layer sp to the second point L2 is the shortest and the diffraction effect is strongest. Thus, at least the second point L2 is elevated by the elevating body Dg, thereby increasing the optical path from the light-emitting center fg to the second point L2, and better ameliorating the diffraction effect of the first opening m1.

The distances from the light-emitting center fg of the sub light-emitting layer sp to the first sidewall cb1 and the second sidewall cb2 may be distances from the light-emitting center fg to the bottom of the sidewalls (the first sidewall cb1 and the second sidewall cb2), distances from the light-emitting center fg to the center of the sidewalls, or distances from the light-emitting center fg to the top of the sidewalls.

Optionally, in the embodiments, the distances from the light-emitting center fg to the center of the sidewalls are selected for comparison of distances. It is to be understood that the distances from the light-emitting center fg to the center of the sidewalls are best balanced as compared to those to the bottom and top of the sidewalls.

Optionally, to better ameliorate the diffraction effect of the first opening m1, the elevating body Dg may also be configured to appropriately elevate other regions other than the first point L1 in addition to elevating the second point L2. For example, it is possible to make the optical path from any point other than the first point L1 to the light-emitting center fg equal to the optical path from the first point L1 to the light-emitting center fg.

For example, in some embodiments of the present disclosure, in a plan view of the display panel 100, in a direction from the second point L2 to the first point L1 on the contoured edge Lk, the distances between the center point zx and the points on the contoured edge Lk increase. The elevating body Dg is configured to extend along the contoured edge Lk and partially overlap the contoured edge Lk, and the thickness of the elevating body Dg decreases in the direction from the second point L2 to the first point L1 on the contoured edge Lk.

In some embodiments of the present disclosure, the elevating body Dg is configured to extend along the first direction F1 or the second direction F2, and in the plan view of the display panel 100, the elevating body Dg passes through multiple first openings m1 at the area of each first opening m1 outside the first point L1 of the first opening m1.

That is, the elevating body Dg is employed to simultaneously elevate the sidewalls of multiple first openings m1, thereby simultaneously improving the diffraction effect of the multiple first openings m1.

In some embodiments of the present disclosure, the black matrix layer bm includes a first portion b1 and a second portion b2. In the thickness direction F3 of the display panel 100, the first portion b1 is disposed on the elevating body Dg in a stacked manner, and the second portion b2 is disposed outside the elevating body Dg.

Based on a side of the substrate 11 closer to the black matrix layer bm, the distance from a side of the first portion b1 away from the substrate 11 to the substrate 11 is the first height g1, the distance from a side of the second portion b2 away from the substrate 11 to the substrate 11 is the second height g2, and the first height g1 is greater than the second height g2.

It will be appreciated that the second portion b2 corresponds to the first point L1 of the outer contour Lk of the first opening m1. Since the elevating body Dg does not elevate the first point L1, the second portion b2 is disposed outside the elevating body Dg; and since the elevating body Dg elevates the first portion b1 that does not have the first point, the first portion b1 is disposed on the elevating body Dg in a stacked manner. The elevating body Dg elevates the first portion b1, so the first height g1 is greater than the second height g2.

It is to be explained that the first portion b1 is disposed on the elevating body Dg in a stacked manner, i.e., some other film layers may be provided between the first portion b1 and the elevating body Dg or the first portion b1 may be directly disposed on the elevating body Dg in a stacked manner.

In some embodiments of the present disclosure, the elevating body Dg is further configured to elevate part of the color film layer cf, and the part of the color film layer cf is configured to be disposed on a side of the elevating body Dg away from the substrate 11. That is, the elevating body Dg may simultaneously elevate the part of the black matrix layer bm and the part of the color film layer cf.

In cases where the elevating body Dg simultaneously elevates the part of the black matrix layer bm and the part of the color film layer cf, the elevating body Dg may not be required to be precisely aligned, which reduces the difficulty of preparation.

Optionally, in some embodiments of the present disclosure, the difference between the first height g1 and the second height g2 is less than or equal to 10 microns.

The larger the difference between the first height g1 and the second height g2 is, the larger the step difference between the first height g1 and the second height g2 is, and the higher the height of the part of the color film layer cf corresponding to the elevating body Dg is, thereby increasing the risk of fracture of the color film layer cf. Therefore, to reduce the risk of fracture of the color film layer cf, the difference between the first height g1 and the second height g2 may be selected to be 1 micron, 2 microns, 3 microns, 4 microns, 6 microns, 7 microns, 8 microns, 9 microns or 10 microns.

In some embodiments of the present disclosure, the display panel 100 includes traces zx, the traces zx being formed in at least one of the driver circuit layer 12 or the light-emitting device layer 13. The traces zx are configured to access electrical signals. In the plan view of the display panel 100, the trace zx pass through the first openings m1. The traces zx are reused as the elevating bodies Dg.

One or more film layers on a side of the traces zx away from the substrate 11 are provided on the traces zx in a stacked manner to form protrusions tb, and the elevated parts of the black matrix layer bm are disposed on the protrusions tb.

It is understood that the traces zx are reused as the elevating bodies Dg, and the process of forming the elevating bodies Dg can be saved. Signal transmission and elevating of the first openings m1 can be realized only by changing the layout of the traces zx. Since the traces zx are formed on a side of the pixel defining layer 132 closer to the substrate 11, the traces zx cannot directly elevate the first openings m1; some film layer(s) above the traces zx is stacked to form the protrusions tb, and the protrusions tb are required to elevate the first openings m1.

Furthermore, it is noted that although the planarization layer Pn and the pixel defining layer 132 have the effect of planarizing the surface, the film thicknesses of the planarization layer Pn and the pixel defining layer 132 may be limited or the thickness of the traces zx may be increased, such that the planarization layer Pn and the pixel defining layer 132 will not planarize the surface completely. Therefore, the protrusions tb can still be formed.

In some embodiments of the present disclosure, the traces zx include at least one of data lines data, scan lines, common electrode lines, touch lines, or cathode auxiliary lines.

It will be appreciated that when the traces zx are formed in the driver circuit layer 12, the traces zx may be at least one of data lines data, common electrode lines, touch lines, or cathode auxiliary lines. When the traces zx are formed in the light-emitting device layer 13, the traces zx are cathode auxiliary lines provided in the same layer as the anodes 130.

Optionally, the thickness of the traces zx is between 6000 angstroms and 9000 angstroms, for example, the thickness may be 6000 angstroms, 6500 angstroms, 7000 angstroms, 7500 angstroms, 8000 angstroms, 8500 angstroms or 9000 angstroms.

It is to be understood that the greater the thickness of the traces zx, the higher the thickness of the protrusions tb for elevation, and the higher the parts of the first openings m1 corresponding to the traces zx are elevated, resulting in a longer optical path of the elevated parts, which better ameliorates the diffraction effect.

Figure 2:
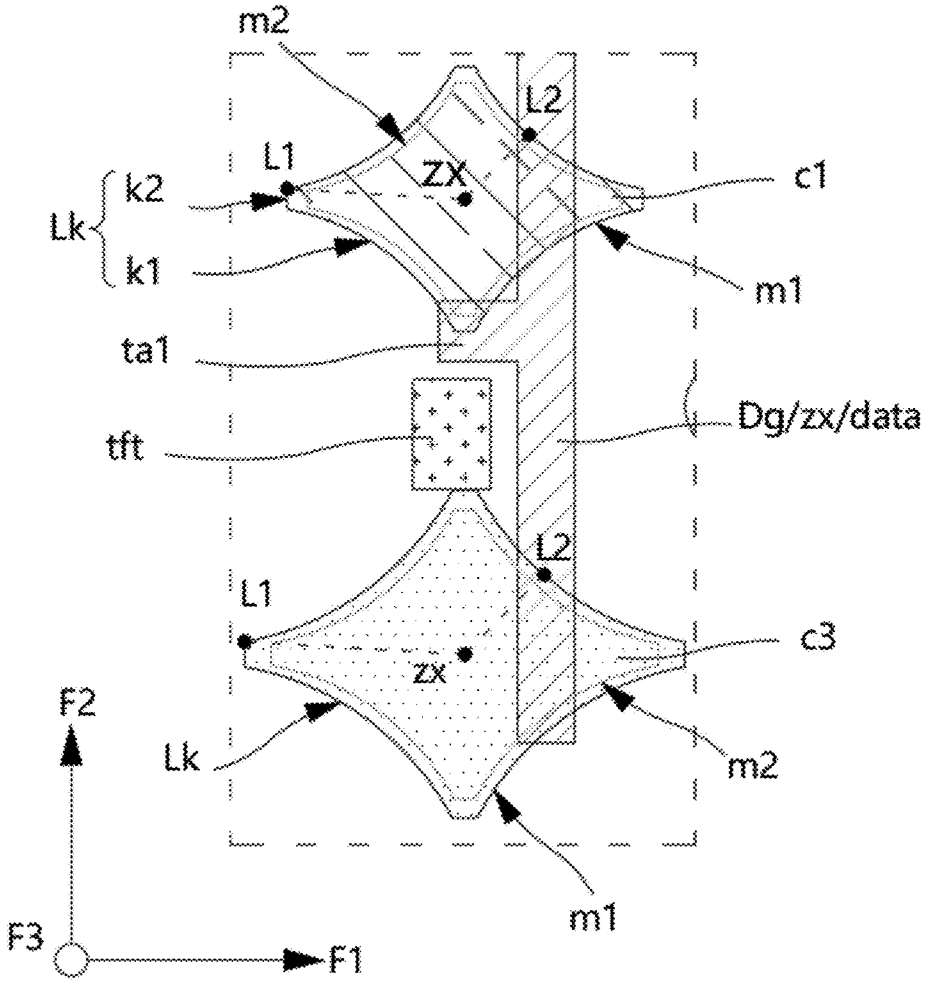
FIG. 2 is an enlarged view of Part A in FIG. 1.

In FIGS. 1 and 2, an example is described in which the traces zx are data lines data, but the embodiment are not limited thereto. For example, the traces zx may be common electrode lines, scan lines, touch lines, or cathode auxiliary lines. The data lines data each extend along the second direction F2 and pass through multiple first openings m1. The data lines data pass through first openings m1 corresponding to red color filter blocks c1 and blue color filter blocks c3.

In some embodiments, the contoured edges Lk of the first openings m1 corresponding to red color filter blocks c1 are first contoured edges, and the contoured edges Lk of the first openings m1 corresponding to blue color filter blocks c3 are second contoured edges.

Optionally, the area of the red color filter blocks c1 is smaller than the area of the blue color filter blocks c3.

The pattern formed by the first contoured edges and the pattern formed by the second contoured edges have the same pattern shape, such as a diamond-like pattern. Each of the first contoured edges or the second contoured edges is a closed pattern formed by alternatively connected first edges k1 and second edges k2, namely, each first edge k1 and its two adjacent second edges k2 form two corners, respectively, the first edge k1 being a curved edge recessed toward the interior of the closed pattern, and the second edges k2 each being a straight edge.

Optionally, two oppositely disposed second edges k2 extend along the first direction F1 and another two oppositely disposed second edges k2 extend along the second direction F2.

Optionally, in some embodiments, the first point L1 is a connection point of a first edge k1 and a second side k2 which extends along the second direction F2. The second point L2 is the center point of a first edge k1. The data lines data each overlap two first edges k1 of the first contoured edges and two first edges k1 of the second contoured edges simultaneously to ameliorate diffraction effects.

Optionally, one data line data elevates the second point L2 of the first contoured edge and the second point L2 of the second contoured edge, thereby ameliorating diffraction effects.

In some embodiments of the present disclosure, each data line data further includes extension portions ta1 connected to the thin-film transistors tft, the extension portions ta1 each elevating at least a second edge k2 extending along the first direction F1, thereby ameliorating the diffraction effect of the first openings m1.

Referring to FIG. 2, in some embodiments of the present disclosure, in the plan view of the display panel 100, the second opening m2 is disposed within the contoured edge of the first opening m1, and the trace zx is disposed outside or passes through the second opening m2.

It is to be understood that since the data line data is provided extending along the second direction F2, the trace zx passes through the second opening m2, but the embodiments are not limited to this. For example, part of the trace zx may also be configured to extend along a peripheral side of the second opening m2 to avoid the second opening m2, so that the trace zx is outside the second opening m2, which reduces the risk of the unevenness of the sub light-emitting layers sp.

Optionally, in some embodiments of the present disclosure, the black matrix layer bm is disposed on the pixel defining layer 132 in a stacked manner in the thickness direction F3 of the display panel 100, and the traces zx, the pixel defining layer 132, and the black matrix layer bm are overlapped in sequence. The traces zx are outside the anodes 130 or the traces zx partially overlap with the anodes 130.

It will be appreciated that, as shown in FIG. 3, the trace zx partially overlaps with the anodes 130, to facilitate simplifying the layout design of the trace zx and save the wiring space of the trace zx. Optionally, the trace zx is located below the anodes 130. The protrusion tb includes the anodes 130, the pixel defining layer 132, the cathodes 133, and the encapsulation layer 14 which are disposed on the trace zx, and the elevated parts of the black matrix layer bm are disposed on the encapsulation layer 14.

Figure 6:
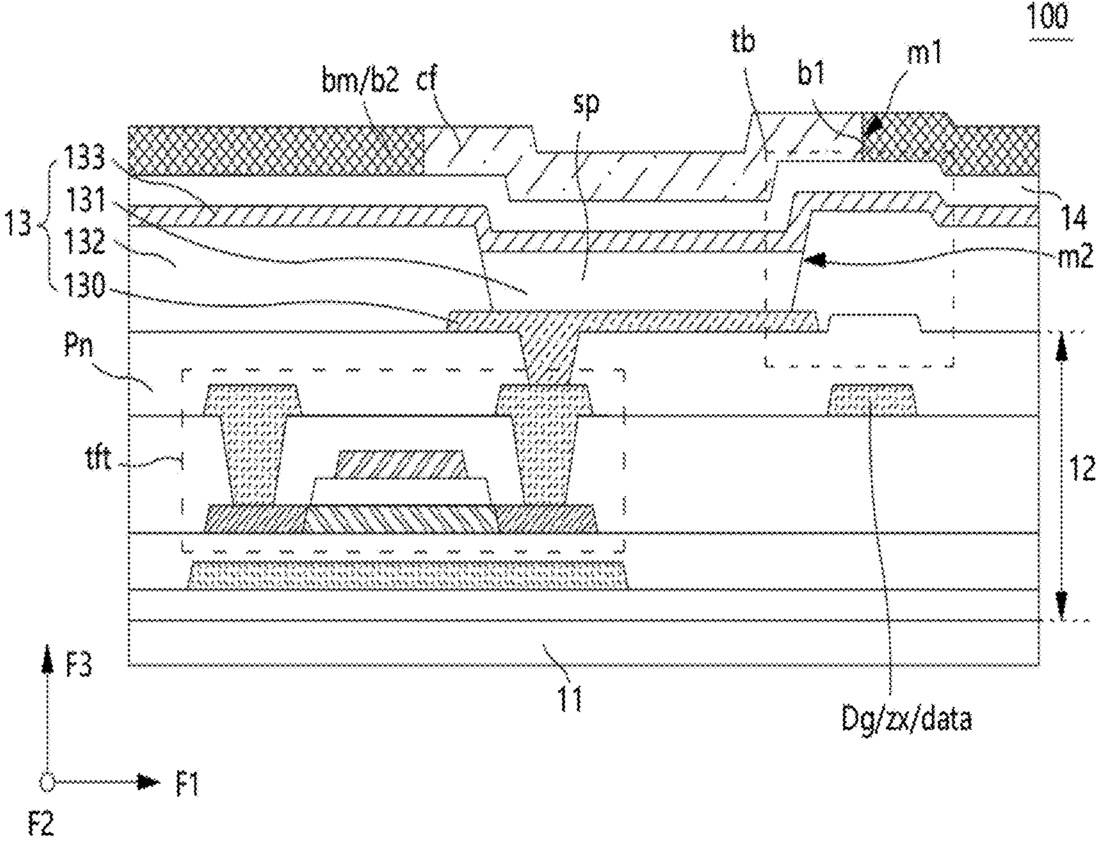
FIG. 6 is a cross-sectional view of another display panel provided by embodiments of the present disclosure.

In some embodiments, as shown in FIG. 6, the trace zx is outside the anodes 130, which can reduce the risk of the unevenness of the sub light-emitting layer sp. Optionally, the trace zx is outside the anodes 130. The protrusion tb includes a portion of the pixel defining layer 132, a corresponding one of the cathodes 133, and a portion of the encapsulation layer 14 which are disposed on the trace zx, and the part of the black matrix layer bm is disposed on the encapsulation layer 14.

Sub-pixels of the light-emitting layer 131 are disposed in the second openings m2.

Figure 7:
FIG. 7 is a plan view of another display panel provided by embodiments of the present disclosure.
Figure 7:
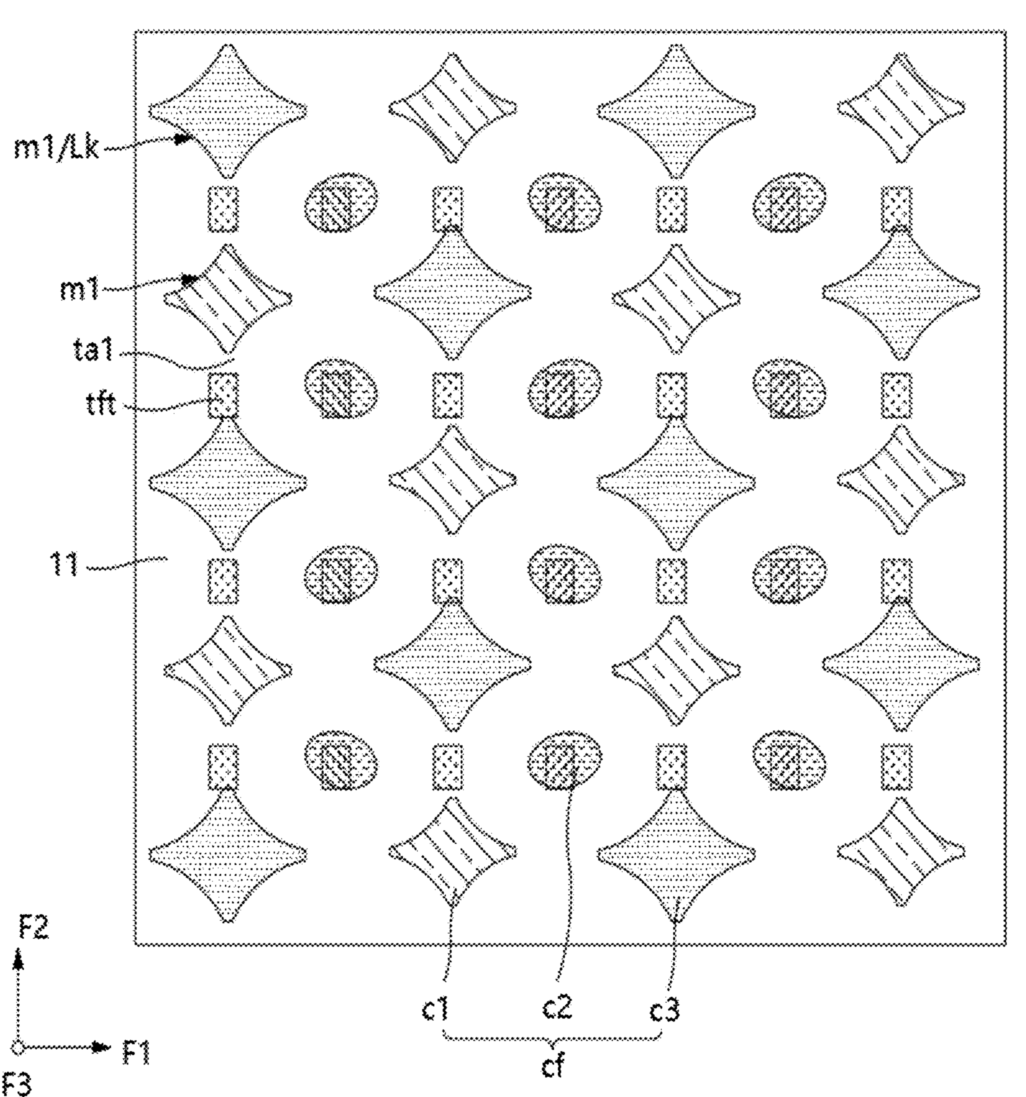
Figure 8:
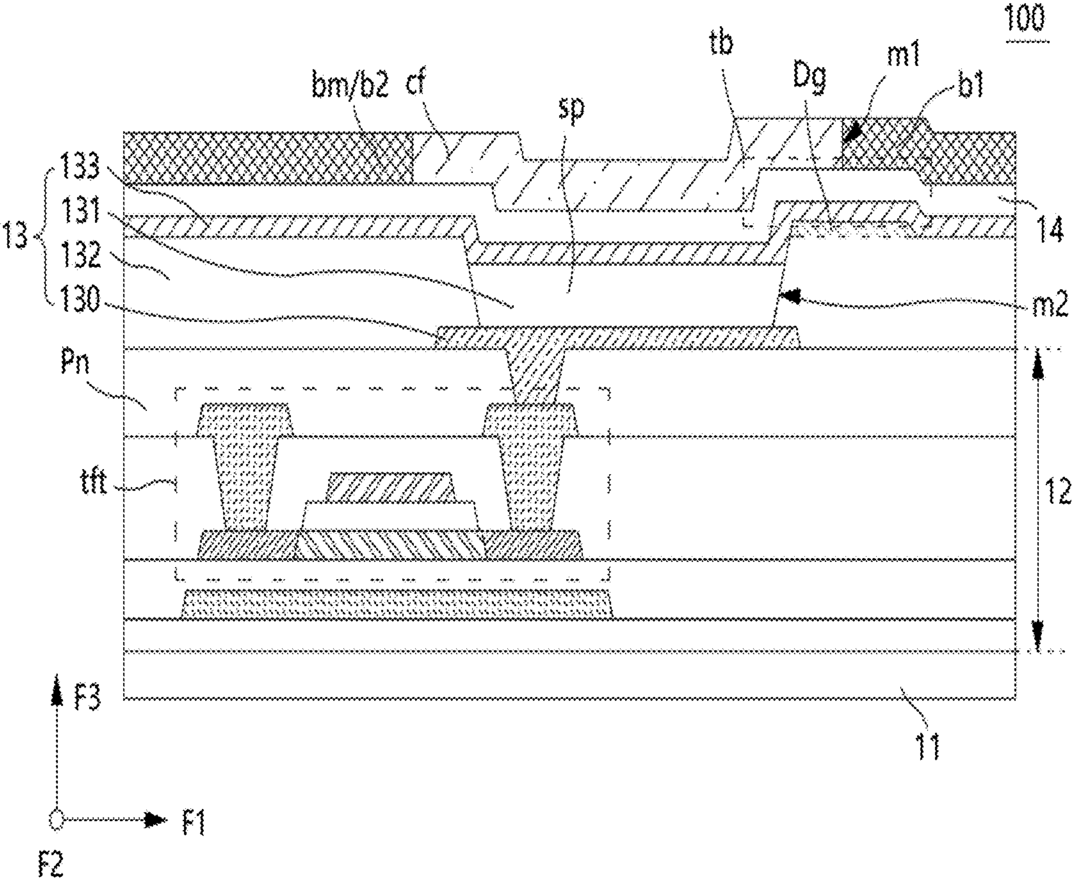
FIG. 8 is a cross-sectional view of another display panel provided by embodiments of the present disclosure.

FIG. 7 illustrates a schematic plan view of a display panel 100 provided by another or more embodiments of the present disclosure, and FIG. 8 illustrates a schematic cross-sectional view of the display panel 100 corresponding to FIG. 7.

In FIGS. 7 and 8, portions of these embodiments that differ from the above-described embodiments will be described below to avoid redundant elaboration.

The light-emitting layer 131 is disposed in the second openings m2.

Referring to FIGS. 7 and 8, the elevating bodies Dg are disposed on a side of the pixel defining layer 132 away from the substrate 11, film layers on a side of the elevating bodies Dg away from the substrate 11 are provided on the elevating bodies Dg in a stacked manner to form protrusions tb, and the elevated parts of the black matrix layer bm are disposed on the protrusions tb.

It will be appreciated that the elevating bodies Dg are disposed on the side of the pixel defining layer 132 away from the substrate 11, thereby avoiding the planarization effect of the planarization layer Pn and the pixel defining layer 132. In this manner, the elevating bodies Dg elevate the first openings m1 with the entire thickness of the elevating bodies Dg, and the thickness of the elevating bodies Dg can be reduced correspondingly.

Optionally, the elevating bodies Dg and the pixel defining layer 132 are formed integrally, i.e., the elevating bodies Dg and the pixel defining layer 132 are formed using the same photomasking process, which saves a process for preparing the elevating bodies Dg.

Optionally, in some embodiments, in the plan view of the display panel 100, the distances from the center point zx to the points on the contoured edge Lk increase in the direction from the second point L2 to the first point L1 on the contoured edge Lk of the first opening m1.

The elevating body Dg is configured to extend along the contoured edge Lk and partially overlap the contoured edge Lk, and the thickness of the elevating body Dg decreases in the direction from the second point L2 to the first point L1 in the contoured edge Lk.

It is to be understood that the elevating body Dg is configured to extend along the contoured edge Lk and partially overlap the contoured edge Lk, such that one elevating body Dg corresponds to one first opening m1. Different elevating bodies Dg may be designed according to different sizes and/or different pattern shapes of first openings m1 for better adapting to and elevating the first openings m1.

In some embodiments, the elevating bodies Dg may also be used in the form of the traces zx, and one elevating body Dg elevates multiple first openings m1, which will not be described herein.

The thickness of the elevating body Dg decreases in the direction from the second point L2 to the first point L1 in the contoured edge Lk, thereby making that the optical path from the light-emitting center fg to any point on the contoured edge Lk has the same distance, maximizing the amelioration of the diffraction effect.

Optionally, the thickness of the pixel defining layer 132 is between 0.9 microns and 2 microns, for example, the thickness may be 0.9 microns, 1 micron, 1.1 microns, 1.2 microns, 1.3 microns, 1.4 microns, 1.5 microns, 1.6 microns, 1.7 microns, 1.8 microns, 1.9 microns or 2 microns.

The thickness of the elevating bodies Dg is between 0.5 microns and 1.5 microns, and the thickness may be, for example, 0.5 microns, 0.6 microns, 0.7 microns, 0.8 microns, 0.9 microns, 1 micron, 1.1 microns, 1.2 microns, 1.3 microns, 1.4 microns or 1.5 microns.

It will be appreciated that the thickness of the elevating bodies Dg can be appropriately adjusted to optimize the amelioration of the diffraction effect, depending on the longest optical path and the risk of breakage of the color film layer cf.

Figure 9:
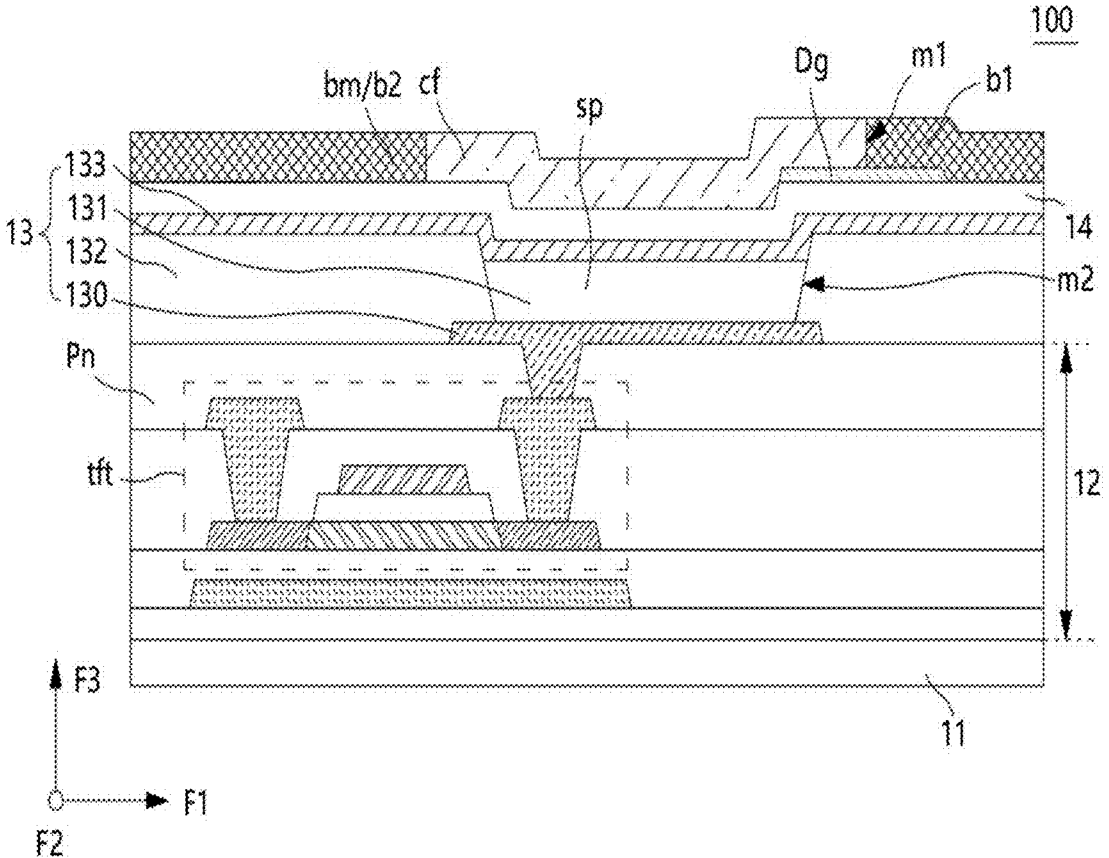
FIG. 9 is a cross-sectional view of another display panel provided by embodiments of the present disclosure.

FIG. 9 illustrates a schematic cross-sectional view of another display panel 100 corresponding to FIG. 8. In FIG. 9, portions of embodiments that differ from the above-described embodiments will be described below to avoid redundant elaboration.

Referring to FIG. 9, the elevating bodies Dg are disposed on a side of the encapsulation layer 14 away from the substrate 11. The elevated parts of the black matrix layer bm are disposed on the elevating bodies Dg.

It is to be understood that the elevating bodies Dg are disposed on the side of the encapsulation layer 14 away from the substrate 11, thereby causing the elevating bodies Dg to directly elevate part of the first openings m1, avoiding the interference of other film layers, and also improving the flatness and the encapsulation effect of the encapsulation layer 14.

The display panel 100 of the embodiments of the present disclosure employs the elevating bodies Dg to elevate the area of the pattern of each first opening m1 outside the first point L1, and thus in a view from the thickness direction F3, the distances from the light-emitting center fg of the sub light-emitting layer sp to points in the area outside the first point L1 approach or are equal to the distance from the light-emitting center fg of the sub light-emitting layer sp to the first point L1, thereby ameliorating the diffraction effect of light emitted from the first opening m1.

What is claimed is:

1. A display panel, comprising:
- a substrate;
- a driver circuit layer disposed on the substrate;
- a light-emitting device layer disposed on a side of the driver circuit layer away from the substrate;
- a black matrix layer disposed on a side of the light-emitting device layer away from the substrate, the black matrix layer being provided with a plurality of first openings;
- a color film layer disposed on the side of the light-emitting device layer away from the substrate and consisting of portions disposed in the first openings; and one or more elevating bodies disposed on a side of the black matrix layer closer to the substrate, each elevating body corresponding to at least one of the first openings;

wherein in a plan view of the display panel, each of the first openings has a pattern with a center point, and a contoured edge of the first opening has points with different distances to the center point among which a first point has the longest distance; the elevating body corresponding to the first opening overlaps with part of the contoured edge and is located in an area of the contoured edge outside the first point; and the one or more elevating bodies are configured to elevate one or more parts of the black matrix layer.

2. The display panel according to claim 1, wherein the points on the contoured edge comprise a second point, whose distance to the center point is the shortest distance, and the elevating body overlaps the second point.

3. The display panel according to claim 2, further comprising traces, each of the traces being formed in at least one of the driver circuit layer or the light-emitting device layer;

wherein in the plan view of the display panel, the trace passes through at least one first opening of the first openings, and the trace is reused as the elevating body corresponding to the at least one first opening; and one or more film layers on a side of the trace away from the substrate are provided on the trace in a stacked manner to form at least one protrusion, and the one or more parts of the black matrix layer are disposed on the at least one protrusion.

4. The display panel according to claim 2, wherein the light-emitting device layer comprises a layer of anodes, a pixel defining layer, a light-emitting layer, and a layer of cathodes;

the anodes are disposed on the side of the driver circuit layer away from the substrate;

the pixel defining layer is disposed on the side of the driver circuit layer away from the substrate, the pixel defining layer is provided with a plurality of second openings, and the second openings expose the anodes;

the light-emitting layer consists of portions disposed in the second openings, the second openings are in one-to-one correspondence with the first openings, and the cathodes are disposed on a side of the light-emitting layer away from the substrate; and the one or more elevating bodies are disposed on a side of the pixel defining layer away from the substrate, one or more film layers on a side of the one or more elevating bodies away from the substrate are provided on the one or more elevating bodies in a stacked manner to form at least one protrusion, and the one or more parts of the black matrix layer are disposed on the at least one protrusion.

5. The display panel according to claim 2, further comprising an encapsulation layer;

the light-emitting device layer comprises a layer of anodes, a pixel defining layer, a light-emitting layer, and a layer of cathodes;

the anodes are disposed on the side of the driver circuit layer away from the substrate;

the pixel defining layer is disposed on the side of the driver circuit layer away from the substrate, the pixel defining layer is provided with a plurality of second openings, and the second openings expose the anodes;

the light-emitting layer consists of portions disposed in the second openings, and the second openings are in one-to-one correspondence with the first openings;

the cathodes are disposed on a side of the light-emitting layer away from the substrate, and the encapsulation layer covers a side of the layer of cathodes away from the substrate; and the one or more elevating bodies are disposed on a side of the encapsulation layer away from the substrate, and the one or more parts of the black matrix layer are disposed on the one or more elevating bodies.

6. The display panel according to claim 2, wherein the light-emitting device layer comprises a light-emitting layer, the light-emitting layer comprises a plurality of sub light-emitting layers, and the sub light-emitting layers are in one-to-one correspondence with the first openings; and in a view in a thickness direction of the display panel, a sidewall of each of the first openings corresponding to the first point is a first sidewall, a sidewall of the first opening corresponding to the second point is a second sidewall, and a distance from a light-emitting center of the sub light-emitting layer corresponding to the first opening to the second sidewall is less than or equal to a distance from the light-emitting center of the sub light-emitting layer to the first sidewall.

7. The display panel according to claim 6, wherein the light-emitting device layer comprises a layer of anodes, a pixel defining layer, and a layer of cathodes;

the anodes are disposed on the side of the driver circuit layer away from the substrate;

the pixel defining layer is disposed on the side of the driver circuit layer away from the substrate, the pixel defining layer is provided with a plurality of second openings, and the second openings expose the anodes;

the light-emitting layer consists of portions disposed in the second openings, the second openings are in one-to-one correspondence with the first openings, and the cathodes are disposed on a side of the light-emitting layer away from the substrate; and the one or more elevating bodies are disposed on a side of the pixel defining layer away from the substrate, one or more film layers on a side of the one or more elevating bodies away from the substrate are provided on the one or more elevating bodies in a stacked manner to form at least one protrusion, and the one or more parts of the black matrix layer are disposed on the at least one protrusion.

8. The display panel according to claim 6, wherein in the plan view of the display panel, distances from the center point to the points on the contoured edge increase in a direction from the second point to the first point on the contoured edge of the first opening; and the elevating body corresponding to the first opening is configured to extend along the contoured edge and partially overlap the contoured edge, and a thickness of the elevating body decreases in the direction from the second point to the first point in the contoured edge.

9. The display panel according to claim 6, wherein the black matrix layer comprises a first portion and a second portion;

in the thickness direction of the display panel, the first portion is disposed on the one or more elevating bodies in a stacked manner, and the second portion is disposed outside the one or more elevating bodies; and based on a side of the substrate closer to the black matrix layer, a distance from a side of the first portion away from the substrate to the side of the substrate is a first height, a distance from a side of the second portion away from the substrate to the side of the substrate is a second height, and the first height is greater than the second height.

10. The display panel according to claim 9, wherein the one or more elevating bodies are further configured to elevate at least one part of the color film layer, and the at least one part of the color film layer is configured to be disposed on a side of the one or more elevating bodies away from the substrate.

11. The display panel according to claim 10, wherein a difference between the first height and the second height is less than or equal to 10 microns.

12. The display panel according to claim 6, further comprising traces, each of the traces being formed in at least one of the driver circuit layer or the light-emitting device layer;

wherein in the plan view of the display panel, the trace passes through at least one first opening of the first openings, and the trace is reused as the elevating body corresponding to the at least one first opening; and one or more film layers on a side of the trace away from the substrate are provided on the trace in a stacked manner to form at least one protrusion, and the one or more parts of the black matrix layer are disposed on the at least one protrusion.

13. The display panel according to claim 12, wherein the traces comprise at least one of data lines, scan lines, common electrode lines, touch lines, or cathode auxiliary lines.

14. The display panel according to claim 13, wherein the light-emitting device layer comprises a layer of anodes, a pixel defining layer, and a layer of cathodes;

the anodes are disposed on the side of the driver circuit layer away from the substrate;

the pixel defining layer is disposed on the side of the driver circuit layer away from the substrate, the pixel defining layer is provided with a plurality of second openings, and the second openings expose the anodes;

the sub light-emitting layers are correspondingly disposed in the second openings, the second openings are in one-to-one correspondence with the first openings, and the cathodes are disposed on a side of the light-emitting layer away from the substrate; and in the plan view of the display panel, each of the second openings is disposed within the contoured edge of a corresponding one of the first openings, and the trace corresponding to the first opening is disposed outside or passes through the second opening.

15. The display panel according to claim 14, wherein in the thickness direction of the display panel, the black matrix layer is disposed on the pixel defining layer in a stacked manner, the traces, the pixel defining layer, and the black matrix layer are overlapped in sequence, and the traces are located outside the anodes or the traces partially overlap with the anodes.

16. The display panel according to claim 15, wherein in a case where the traces are located outside the anodes, the display panel further comprises an encapsulation layer, and the encapsulation layer covers the cathodes; and the protrusion comprises a portion of the pixel defining layer, a corresponding one of the cathodes, and a portion of the encapsulation layer which are disposed on the trace, and the one or more parts of the black matrix layer are disposed on the encapsulation layer.

17. The display panel according to claim 1, further comprising traces, each of the traces being formed in at least one of the driver circuit layer or the light-emitting device layer;

wherein in the plan view of the display panel, the trace passes through at least one first opening of the first openings, and the trace is reused as the elevating body corresponding to the at least one first opening; and one or more film layers on a side of the trace away from the substrate are provided on the trace in a stacked manner to form at least one protrusion, and the one or more parts of the black matrix layer are disposed on the at least one protrusion.

18. The display panel according to claim 1, wherein the light-emitting device layer comprises a layer of anodes, a pixel defining layer, a light-emitting layer, and a layer of cathodes;

the anodes are disposed on the side of the driver circuit layer away from the substrate;

the pixel defining layer is disposed on the side of the driver circuit layer away from the substrate, the pixel defining layer is provided with a plurality of second openings, and the second openings expose the anodes;

the light-emitting layer consists of portions disposed in the second openings, the second openings are in one-to-one correspondence with the first openings, and the cathodes are disposed on a side of the light-emitting layer away from the substrate; and the one or more elevating bodies are disposed on a side of the pixel defining layer away from the substrate, one or more film layers on a side of the one or more elevating bodies away from the substrate are provided on the one or more elevating bodies in a stacked manner to form at least one protrusion, and the one or more parts of the black matrix layer are disposed on the at least one protrusion.

19. The display panel according to claim 18, wherein the elevating body and the pixel defining layer are formed integrally.

20. The display panel according to claim 1, further comprising an encapsulation layer;

the light-emitting device layer comprises a layer of anodes, a pixel defining layer, a light-emitting layer, and a layer of cathodes;

the anodes are disposed on the side of the driver circuit layer away from the substrate;

the pixel defining layer is disposed on the side of the driver circuit layer away from the substrate, the pixel defining layer is provided with a plurality of second openings, and the second openings expose the anodes;

the light-emitting layer consists of portions disposed in the second openings, and the second openings are in one-to-one correspondence with the first openings;

the cathodes are disposed on a side of the light-emitting layer away from the substrate, and the encapsulation layer covers a side of the layer of cathodes away from the substrate; and the one or more elevating bodies are disposed on a side of the encapsulation layer away from the substrate, and the one or more parts of the black matrix layer are disposed on the one or more elevating bodies.

* * * * *